United States Patent

Bernhardt et al.

(10) Patent No.: US 9,842,752 B2
(45) Date of Patent: Dec. 12, 2017

(54) OPTICAL HEAT SOURCE WITH RESTRICTED WAVELENGTHS FOR PROCESS HEATING

(71) Applicants: David Bernhardt, Hudson, MA (US); W. Davis Lee, Newburyport, MA (US); William DiVergilio, Green Bay, WI (US); Marvin Farley, Ipswich, MA (US)

(72) Inventors: David Bernhardt, Hudson, MA (US); W. Davis Lee, Newburyport, MA (US); William DiVergilio, Green Bay, WI (US); Marvin Farley, Ipswich, MA (US)

(73) Assignee: Axcelis Technologies, Inc., Beverly, MA (US)

(*) Notice: Subject to any disclaimer, the term of this patent is extended or adjusted under 35 U.S.C. 154(b) by 28 days.

(21) Appl. No.: 13/923,955

(22) Filed: Jun. 21, 2013

(65) Prior Publication Data

US 2015/0037983 A1 Feb. 5, 2015

(51) Int. Cl.
*H01L 21/67* (2006.01)
*H01J 37/317* (2006.01)
*H01L 21/265* (2006.01)
*H05B 3/00* (2006.01)

(52) U.S. Cl.
CPC .... *H01L 21/67115* (2013.01); *H01J 37/3171* (2013.01); *H01L 21/26506* (2013.01); *H01L 21/67201* (2013.01); *H01L 21/67213* (2013.01); *H05B 3/0047* (2013.01); *H01J 2237/2001* (2013.01)

(58) Field of Classification Search
CPC ......... H01L 21/67115; H01L 21/67213; H01L 21/67248; H01J 2237/2001; H05B 3/0047
USPC ........................................... 250/492.1–492.3
See application file for complete search history.

(56) References Cited

U.S. PATENT DOCUMENTS

| | | | | |
|---|---|---|---|---|
| 3,836,751 A * | 9/1974 | Anderson | ..................... | 219/411 |
| 3,908,183 A * | 9/1975 | Ennis, Jr. | ..................... | 257/734 |
| 4,818,327 A * | 4/1989 | Davis et al. | ............ | 156/345.37 |
| 6,744,017 B2 * | 6/2004 | Leavitt et al. | ................ | 219/390 |
| 2002/0084424 A1 * | 7/2002 | O'Carroll et al. | ......... | 250/492.1 |
| 2008/0042078 A1 * | 2/2008 | England et al. | ......... | 250/492.21 |
| 2008/0067432 A1 * | 3/2008 | Suvorov | .................. | 250/492.21 |
| 2008/0219824 A1 * | 9/2008 | Newman et al. | .......... | 414/744.5 |
| 2010/0301236 A1 * | 12/2010 | Shieh et al. | ............. | 250/492.21 |
| 2011/0227042 A1 * | 9/2011 | Takada et al. | .................. | 257/19 |
| 2011/0291022 A1 * | 12/2011 | Lee et al. | ................. | 250/453.11 |

\* cited by examiner

*Primary Examiner* — Michael Maskell
(74) *Attorney, Agent, or Firm* — Denis A. Robitaille

(57) ABSTRACT

A semiconductor manufacturing system or process, such as an ion implantation system, apparatus and method, including a component or step for heating a semiconductor workpiece are provided. An optical heat source emits light energy to heat the workpiece. The optical heat source is configured to provide minimal or reduced emission of non-visible wavelengths of light energy and emit light energy at a wavelength in a maximum energy light absorption range of the workpiece.

12 Claims, 5 Drawing Sheets

OPTICAL HEAT SOURCE WITH RESTRICTED WAVELENGTHS FOR PROCESS HEATING

TECHNICAL FIELD

The present invention relates generally to optical heat sources and more specifically to an optical heating source for heating of a workpiece in an ion implantation system.

BACKGROUND

Various processes in the fabrication of semiconductor devices require heating of a silicon wafer, or workpiece, to a prescribed temperature. Indeed, there have been continued and ongoing efforts to improve semiconductor manufacturing processes and equipment used therefor that have centered around heating the workpiece. For example, it is well known that high temperature ion implantation, with wafer temperatures in the range of 150-600 C, may offer significant advantages over room-temperature ion implantation. High temperature wafer processing has also been found to assist in the generation and/or enhancement of certain chemical and physical reactions. For example, it may be desirable to raise the temperature of the workpiece to assist in driving off volatile surface impurities. As a further example, it may be desirable to raise wafer temperature following a process in which wafer temperature has been cooled below ambient temperature, so that atmospheric water-vapor present in the vicinity of the wafer does not condense onto the wafer when it is removed from the process tool into the ambient environment.

Heating assemblies for raising the temperature of a semiconductor wafer to an elevated level are well known. For example, U.S. Pat. No. 6,744,017, assigned to IBIS Technology Corp., discloses an ion implantation system typically used in the processing of semiconductor wafers wherein the semiconductor wafer is exposed to a beam of ions having a selected energy and the wafer is heated to elevated temperatures during ion implantation steps. High temperature ion implantation has been found to dynamically anneal defects generated in the wafer as a result of ion bombardment, and/or during subsequent annealing steps.

In another specific example, commonly assigned US Patent Application Publication No. 2011/0291022 describes a problem found in ion implantation processes, wherein a workpiece is typically transferred to a load lock chamber subsequent to implantation of ions. When the load lock chamber is opened to remove the workpiece, condensation can occur that can result in deposition of particles on the workpiece, and/or leave residues on the workpiece. That patent application describes a solution directed toward mitigation of condensation on a workpiece when transferred from a relatively cold environment to a warmer environment by heating the workpiece prior to exposure to the warmer environment. Process heating has previously been accomplished utilizing a number of different methods, including exposing the workpiece to heated vapors, light sources, and/or direct contact thermal-transfer from a heated source. These methods, however, convey energy for heating of the workpiece over a wide range that can be both useful and detrimental to the purpose of increasing the temperature of the workpiece.

In particular, the use of light sources, or more generally, optical heat sources in the processing of silicon wafers is disclosed in U.S. Pat. No. 8,450,193, wherein an exemplary method for heating a wafer for high-temperature ion implantation is described, including an optical heat source that may comprise an array of heater lamps mounted in front of a reflector for emitting light onto the wafer. According to one embodiment, a laser wavelength in the infrared range may be efficiently absorbed by the wafer.

However, heating a silicon wafer via light energy can be problematic because silicon wafers are particularly absorptive of light in the visible range of wavelengths, and transparent to and/or non-absorptive of light in the infrared wavelengths. Since typical incandescent or incandescent-halogen-cycle lamps emit approximately 15-20% of light energy in the visible wavelength, as much as 85% of the light energy is not absorbed by the wafer. In addition to the obvious inefficiencies associated with the use of such optical heat sources, the energy associated with the infrared wavelengths may be detrimentally absorbed by other materials and components in the heating process environment.

Therefore, a need exists in the art for an apparatus, system, and method for efficient optical heating systems for use in processing of silicon wafers, wherein light wavelengths emitted from the optical heating system can be selectively provided within a predetermined range of wavelengths. More specifically, a need exists for an apparatus, system, and method for providing an optical heating source for heating a workpiece, wherein the optical heating source is configured to emit light energy in the visible wavelength range, while emitting reduced light energy in the nonvisible wavelength range.

SUMMARY

The present invention overcomes the limitations of the prior art by providing a system, apparatus, and method for heating of a semiconductor workpiece via an optical heat source, wherein light wavelengths emitted from the optical heat source can be selectively provided within a predetermined range of wavelengths. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Aspects of the invention can facilitate semiconductor manufacturing processes, and in particular ion implantation processes by providing an ion implantation system in which an optical heat source is configured to emit light energy in a selected range of wavelengths, particularly visible wavelengths, for heating a workpiece. Further, the optical heat source is configured to minimize or reduce the emission of non-visible wavelengths of light energy, which are not absorbed by the workpiece and which may be detrimental to ancillary components associated with the heating environment, as well as the general purpose of increasing the temperature of the workpiece. Associated apparatus and a method for processing a semiconductor workpiece are disclosed herein.

In one embodiment of the present invention, an apparatus for processing of a semiconductor workpiece is disclosed, comprising: a workpiece support configured to support the workpiece during heating of the workpiece; and an optical heat source for emitting optical heat energy in a direction toward the workpiece, the optical heat source being configured to minimize the emission of non-visible wavelengths of optical energy. The optical heat source of the present invention may be selectively operative to emit a predetermined wavelength or range of wavelengths within a selected range of visible light wavelengths. The workpiece support can be configured in various forms to support the workpiece in various processing environments, including but not limited to: a process chamber compatible with ion implantation; a load lock chamber for vacuum processing of the workpiece; or an atmospheric environment.

In yet another embodiment of the present invention, an ion implantation system is disclosed, comprising an ion beamline for generating a beam of ions and transporting the ions in a direction to a workpiece; a process chamber for supporting the workpiece; and a heating source configured to emit light energy in a direction toward the workpiece for heating the workpiece, wherein the optical heat source is configured to minimize the emission of non-visible wavelengths of light energy.

In yet another embodiment of the present invention, a method for processing a semiconductor workpiece is disclosed, comprising: placing the workpiece on a support member; and heating the workpiece via an optical heating source, wherein the optical heating source is configured to provide minimized emission of non-visible wavelengths of light energy.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth, in detail, certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1A:
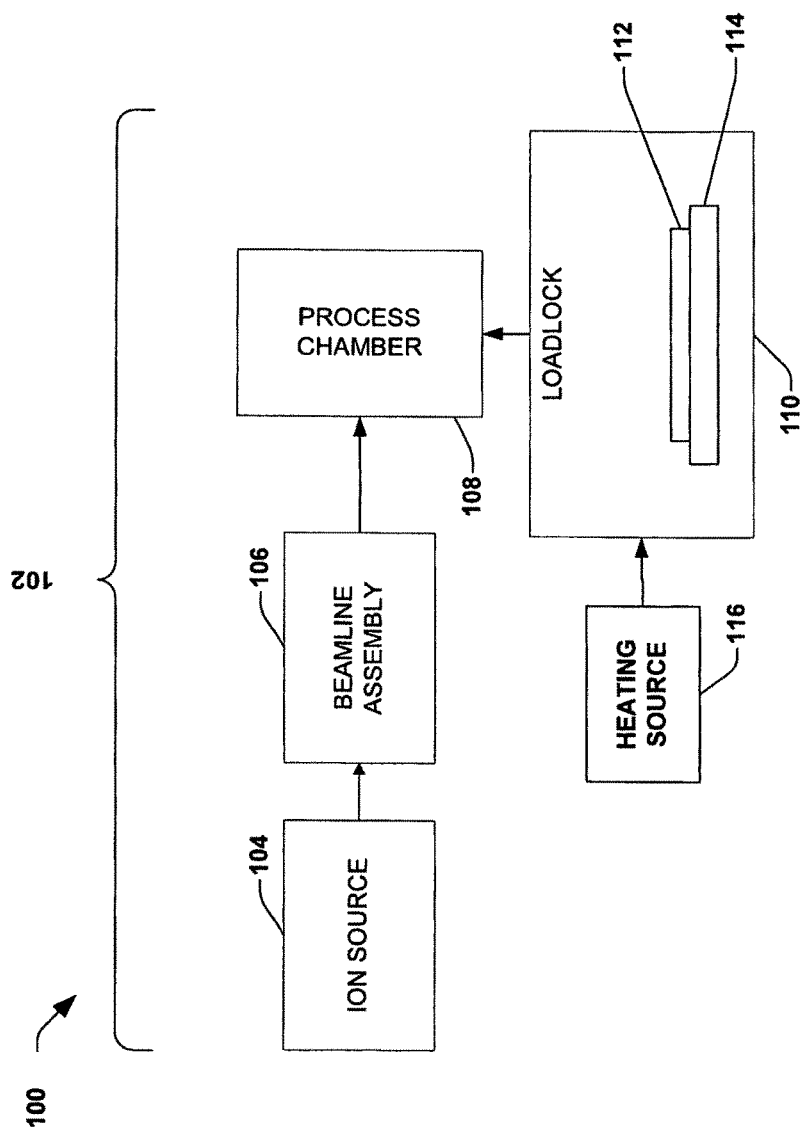
FIG. 1A is a block diagram of an ion implantation system incorporating one embodiment of an optical heating source in accordance with an aspect of the present invention.

The present disclosure is directed generally toward a system, apparatus, and method for heating a semiconductor wafer in a semiconductor manufacturing equipment environment. Although the present invention will be described in conjunction with an ion implantation system as an exemplary semiconductor manufacturing equipment environment, it will be understood that the present invention could be incorporated into any piece of semiconductor manufacturing equipment, wherein a significant aspect of the invention is based on an understanding that silicon wafers typically used in semiconductor manufacturing do not absorb non-visible wavelengths of light energy. Accordingly, the present invention will now be described with reference to the drawings, wherein like reference numerals may be used to refer to like elements throughout. It will be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but are intended to be only limited by the appended claims and equivalents thereof.

It is also noted that the drawings and figures provided herein are intended to give an illustration of some aspects of embodiments of the present invention and therefore are to be regarded only as schematic representations. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to the invention. Furthermore, the features of the various embodiments and examples described herein may be combined with each other unless specifically noted otherwise.

It is also to be understood that in the following description, any direct connection or coupling between functional blocks, devices, components, or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

Referring initially to FIG. 1A, an ion implantation system 100 suitable for implementing one or more aspects of the invention is depicted in block diagram form. The ion implantation system 100, for example, comprises an ion implantation apparatus 102 configured to provide a beam of ions to a process chamber 108. During operation, a workpiece 112 (e.g., a semiconductor wafer, display panel, etc.) positioned in the processing chamber 108 so as to intercept the beam of ions for implantation of ions therein.

In one example, the ion implantation apparatus 102 is configured to form an ion beam, wherein the ion implantation apparatus 102 comprises an ion source 104 configured to provide a beam of ions to a beamline assembly 106, wherein the beamline assembly 106 is further configured to mass analyze and or focus the beam of ions, and to consequently provide the ion beam of particular specifications to an end station comprising the process chamber 108. Alternatively, the ion implantation system 100 can comprise a plasma chamber (not shown) or any other apparatus configured to implant or dope a workpiece 112 with a plurality of ions. For example, the ion implantation system can take the form of a serial or batch type ion implanter, a spot, spot scanned, or ribbon beam implanter, or a plasma immersion or doping system, and all such ion implantation apparatus configurations are contemplated as falling within the scope of the present invention. In addition, it will be understood that the present invention can apply to other types of semiconductor manufacturing systems and is not limited to ion implantation systems.

In a typical semiconductor manufacturing system, a load lock chamber 110 is operatively coupled to the process chamber 108, wherein the load lock chamber 110 is configured to provide a substantially dry and selectively controlled vacuum environment, and further provides for a transfer of workpieces 112 to and from a pressure differential vacuum environment to a vacuum or non-vacuum environment. The load lock chamber 110, for example, comprises a workpiece support 114 configured to support a workpiece 112 during transfer between the pressure differentiated environments of the ambient work environment and the high vacuum process chamber environment. In accordance with the present invention, the loadlock 110 includes an optical heating source 116, which is either coupled to, or integrated into the loadlock assembly 110 for heating of the workpiece 112 therein.

The optical heat source 116 is associated with the load lock chamber 110, wherein the optical heat source 116 is configured to emit light energy for heating of the workpiece 112 and to provide minimal and/or reduced emission of non-visible wavelengths of light energy concurrent with the workpiece 112 residing within the load lock chamber 110. In the embodiment of FIG. 1A, the optical heat source is positioned external to the load lock chamber 110. In this embodiment, the load lock chamber 110 is provided with a window 120 (depicted in FIG. 1B), operative to allow the emitted light energy to be transmitted into the load lock chamber 110. This window 120 can include an integrated or separate and independent filter and/or reflector element 118, as will be described infra, for providing effective minimization and/or reduction of non-visible wavelengths of light energy exposure to the workpiece within the load lock 110.

In accordance with the present invention, the optical heat source 116 is configured to emit light energy associated with a wavelength or wavelength spectrum within the maximum absorption range of the workpiece 112 in the visible light spectrum. Thus, in one embodiment, the optical heat source 116 may comprise a wavelength-specific lamp such as an arc lamp with a selective filter that will emit light energy in a wavelength range of from about 400 nm to about 1000 nm. In another embodiment, the heat source 116 may comprise a light emitting diode (LED) capable of emitting light energy at a predetermined specific wavelength or in a predetermined wavelength spectrum. In yet another example, the optical heat source 116 may comprise a plurality of LEDs, wherein the number of LEDs may range from about 600 to about 800 or more LEDs. In one embodiment, light emitting diodes for emitting visible or deep blue light can be utilized. In one embodiment, a re-radiative material is applied to the LED in order to capture or filter substantially all of the light energy emitted from the LEDs that may be of a non-visible wavelength, and re-radiate the energy at a different wavelength, which is within the preferred maximum energy light absorption range. The re-radiative material can comprise, in one embodiment, a phosphor coating, or, most generally, a substance that exhibits the phenomenon of luminescence, including both phosphorescent materials known for their use in radar screens, CRT displays and fluorescent lights, which show a slow decay in brightness (>1 ms), and fluorescent materials, common in CRT and plasma video display screens, sensors, and white LEDs, where the emission decay takes place over tens of nanoseconds. Phosphors comprising transition metal compounds or rare earth compounds of various types are contemplated.

Figure 1B:
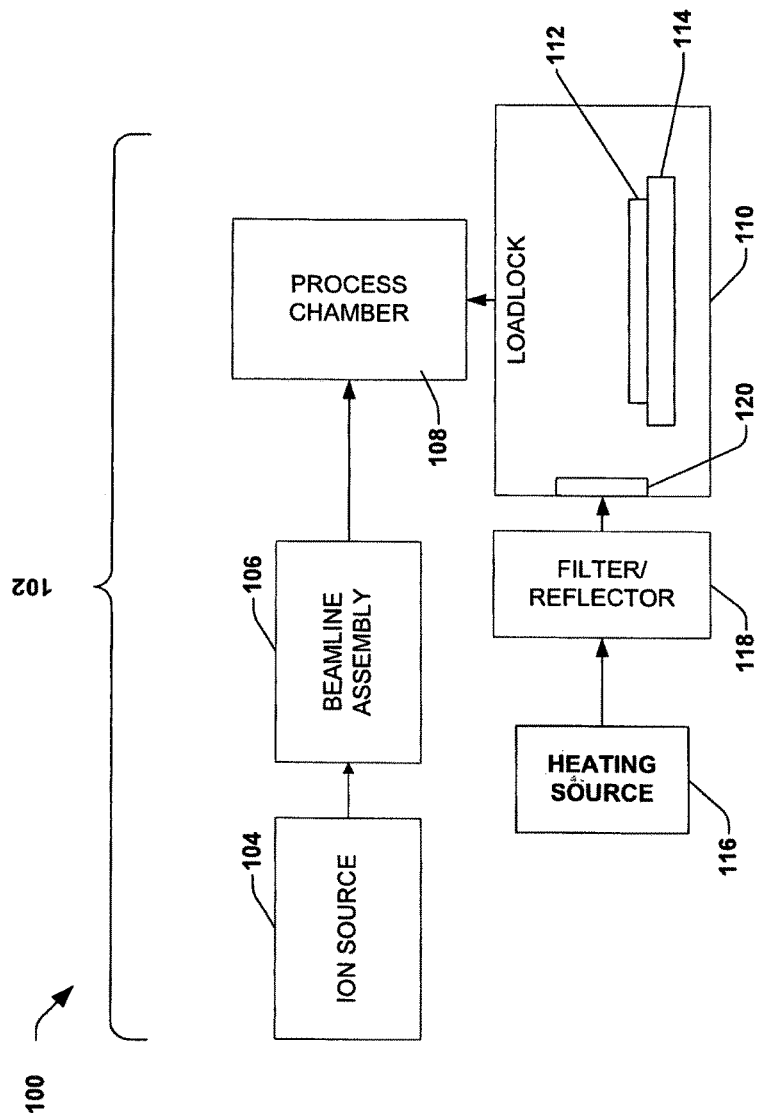
FIG. 1B is a block diagram of an ion implantation system incorporating an alternative embodiment of an optical heating source in accordance with an aspect of the invention.

FIG. 1B illustrates alternative embodiments of the invention, wherein the optical heat source 116 generates and emits unspecified wavelengths. Exemplary optical heat sources can include incandescent lamps, halogen lamps, broad wavelength LEDs and the like. In this embodiment, a filter or reflector 118 is coupled to optical heat source 116, as shown in FIG. 1B, to provide the desired visible wavelength heat energy. Filter or reflector 118 is configured to absorb, filter or reflect non-visible wavelengths of light energy that otherwise can be absorbed by components associated with and be detrimental to the heating process and/or wafer processing environment as a whole, such as, for example, photoresist or dielectric layers and coatings present on the workpiece 112, and other process coatings present on the workpiece supporting structure 114, the wafer transfer mechanisms, sensors and control devices (not shown), or on surfaces of the load lock chamber 110 itself. In one embodiment, the filter or reflector 118 may comprise a wave-length dependent filter which absorbs non-visible wavelengths of light energy emitted by the heat source 116. In another embodiment, a wavelength selective reflector 118 may be coupled to the heat source 116 to reflect non-visible wavelengths of light energy away from the workpiece 112.

In the case of a filter or reflector 118 that is coupled to heat source 116 and positioned external to the load lock chamber 110, as illustrated in FIG. 1B, an optical energy conducting material or window 120 is coupled to or integrated into a side wall of the load lock chamber 110. The optical energy conducting material 120 is operable to transport or transmit the light energy emitted in a direction toward the workpiece 112 to be heated. The optical energy conducting material can comprise, in one embodiment, a window in the load lock chamber 110, as illustrated in FIG. 1B. In an alternative embodiment, the conducting material can comprise an internally reflective optical guide, fiber, rod or tube to direct the light energy to the workpiece 112 to be heated.

Figure 1C:
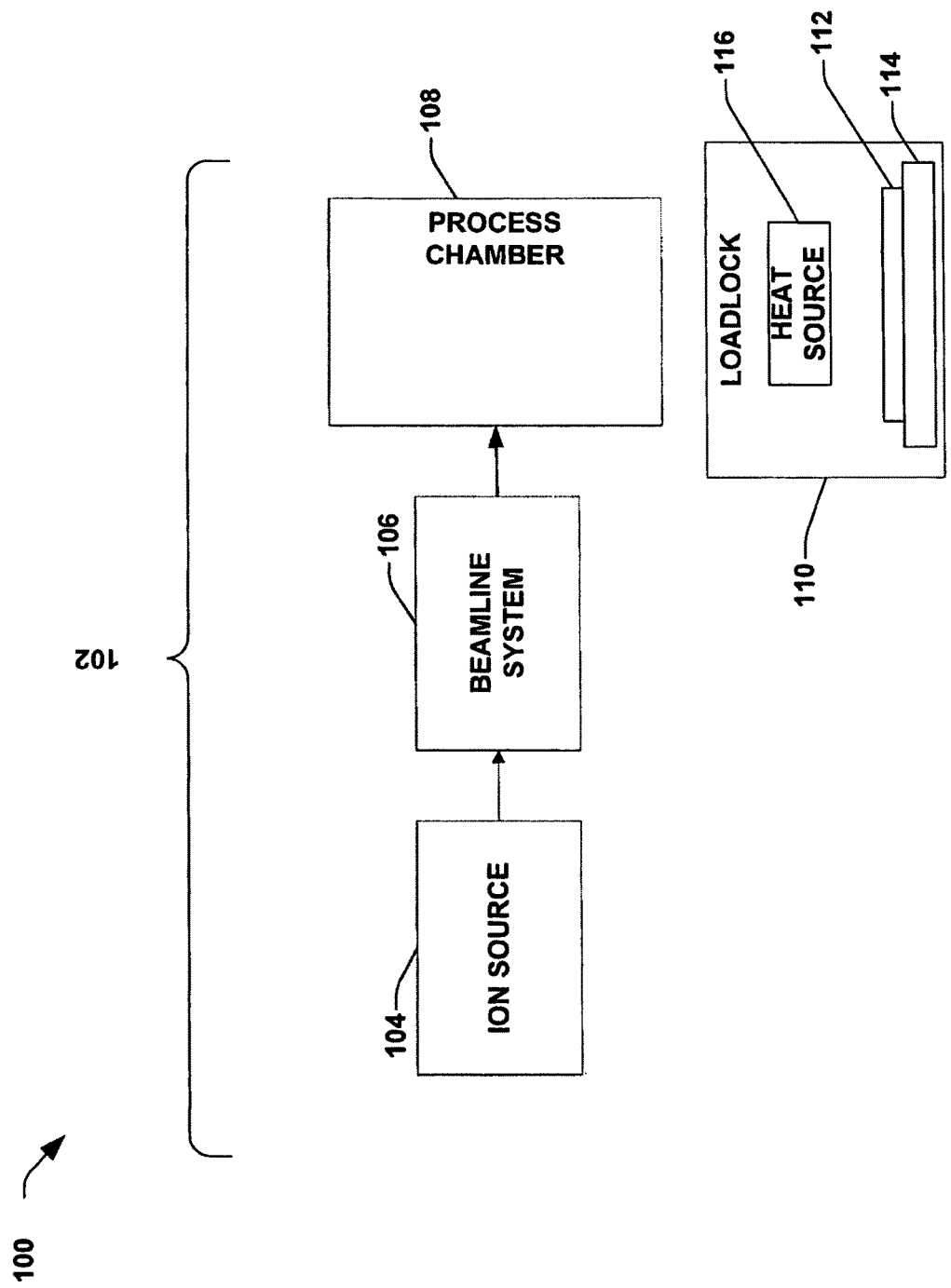
FIG. 1C is a block diagram of an ion implantation system incorporating a further embodiment of an optical heating source in accordance with an aspect of the invention.

FIG. 1C illustrates a further embodiment of the present invention wherein the optical heat source 116 is positioned within the load lock chamber 110. In this embodiment, the optical heat source 116 would be preferably situated in a position to transmit optical heat energy in a direction perpendicular to the surface of workpiece 112. The optical heat source can be configured to provide selective wavelengths or a selective wavelength range, or can be integrated with a lightwave absorbing filter or reflective element similar to that described hereinabove with respect to the embodiment of FIG. 1B to provide a predetermined wavelength of optical energy to the workpiece with minimal or reduced non-visible wavelengths.

Figure 2:
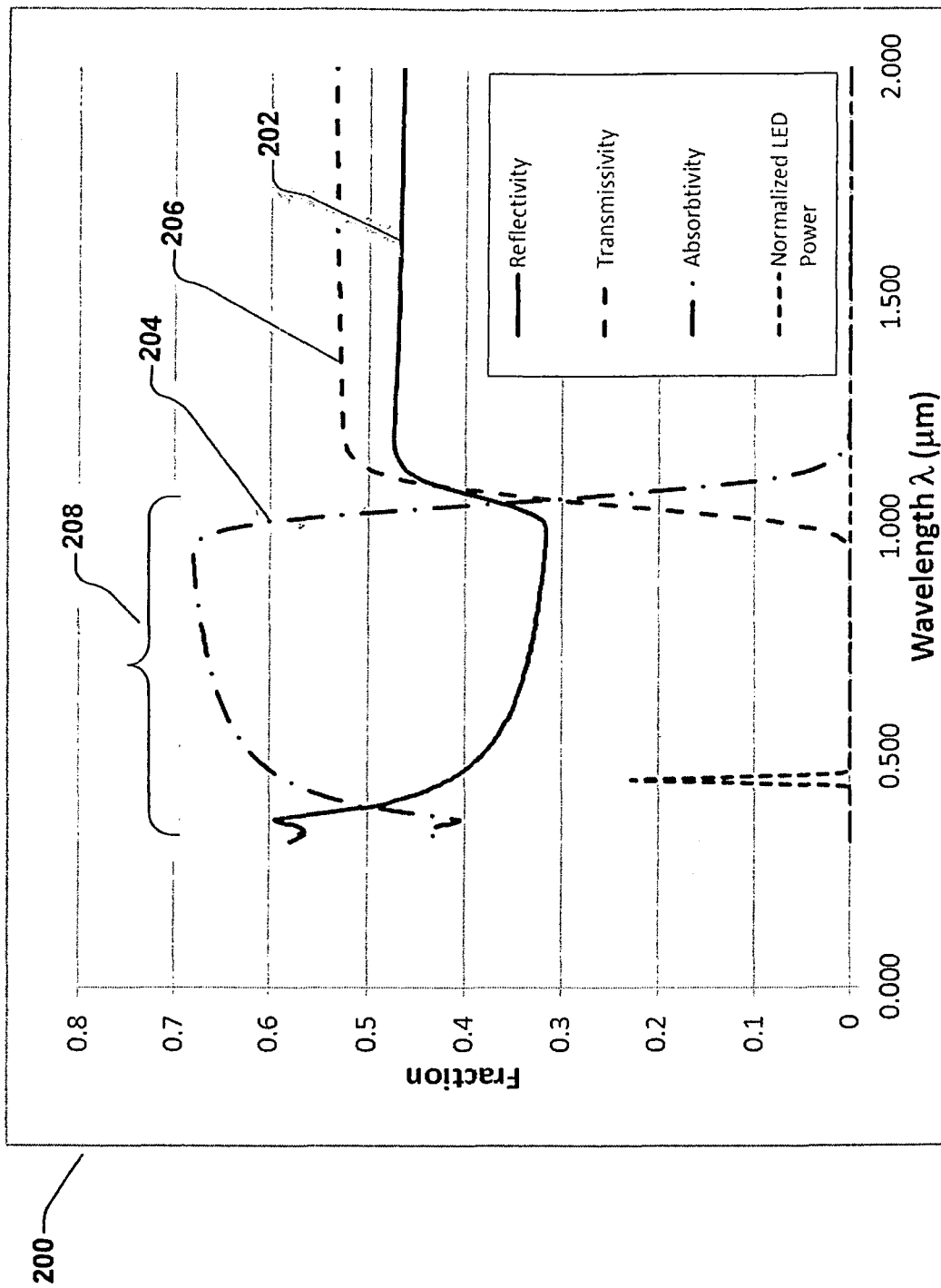
FIG. 2 illustrates an exemplary graph of a wavelength of light emitted by an optical heat source according to an aspect of the invention.

FIG. 2 illustrates the optical properties of an exemplary of a sample workpiece 112 of the type that would typically be used in a semiconductor processing environment, wherein the workpiece is comprised of a 0.025 mm thick, 300 mm diameter silicon wafer. In the spectral distribution 200 of FIG. 2, for example, reflected radiation 202, absorbed radiation 204, and transmitted radiation 206 are shown, wherein the wavelength range of maximum light energy absorption range 208 can be seen as being between approximately 0.4 and 1.1 um. Thus, within this absorption range 208, approximately 40%-70% of the light energy from an optical heat source 116 is absorbed by the workpiece 112 of FIGS. 1A-1C.

Figure 3:
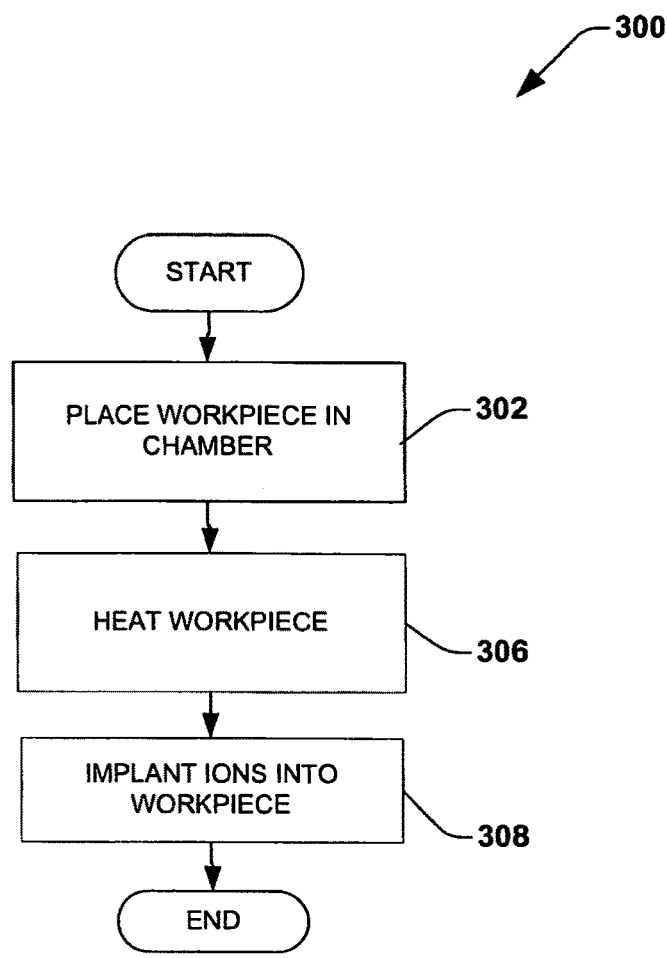
FIG. 3 is a flow diagram illustrating one embodiment of a method of processing a semiconductor workpiece in accordance with an aspect of the invention.

FIG. 3 is a flow diagram illustrating a method 300 for processing a semiconductor workpiece 112 in association with the ion implantation system 100. It should be noted that the present disclosure is not limited to the exemplary flow provided, and that various other transferences of workpieces 112 into, out of, and within the system 100 are contemplated as falling within the scope of the present disclosure.

The method 300 of FIG. 3 begins at act 302, wherein a workpiece to be heated is provided in a load lock chamber, which is operably coupled to an optical heat source arranged to emit light energy of a specific wavelength in the visible spectrum or which has been configured to reduce the emission of non-visible wavelengths of light energy. It should be noted that where a specific wavelength of light energy is emitted, it is understood to comprise both a single wavelength of electromagnetic radiation, as well as a plurality or range of wavelengths of electromagnetic radiation or light. The wavelength can be selected based, at least in part, on a maximum absorptive range of light energy associated with the workpiece.

In act 304, the workpiece is exposed to the optical heat source to raise the temperature of the workpiece. The workpiece can be heated to a temperature of from about 25° C. to about 90° C. in approximately 20 seconds using and LED current of 1500 mA to produce light radiation of approximately 420 um. In act 306, the workpiece is transferred from the load lock chamber to a process chamber for ion implantation. It should be noted, however, that other processes may occur between heating of the workpiece and transfer of the workpiece to the process chamber. For example, as a corollary to the process described hereinabove, process 300 begins with process step 302 and the workpiece is provided in a process chamber for ion implantation thereof. Subsequent to ion implantation, the workpiece is transferred to a load lock chamber in process step 306, wherein the loadlock chamber is operably coupled to an optical heat source arranged to emit light energy of a specific wavelength in the visible spectrum or which has been configured to reduce the emission of non-visible wavelengths of light energy. Thereafter, the workpiece can be removed from the loadlock chamber. This particular process methodology may be advantageous in a low temperature ion implantation process, wherein a cooled wafer is implanted with ions, and the cold workpiece is heated after implant to prevent water vapor condensation to occur when the workpiece is removed from the vacuum environment. Thus, the ion implantation apparatus 100 of the disclosure may be configured to implant ions into the workpiece 112 at a low process temperature (e.g., any temperature below a temperature of the external environment), wherein condensation has a tendency to form on the workpiece 112 if the workpiece is transferred from the implantation system to an external environment when the workpiece is cooler than an ambient dew point in the external environment. Alternatively, the workpiece can further develop frost upon being exposed to ambient water vapor (e.g., humidity) in the air of the external environment. Accordingly, in accordance with one aspect of the invention, the workpiece 112 can be transferred from the process chamber following ion implantation to a load lock chamber, where the work piece can be heated by an optical heat source to a temperature of the ambient atmosphere or at least a temperature above the dew point thereof.

In addition, while the method as described illustrates heating of the workpiece prior to or subsequent to ion implantation, it is also contemplated that heating of the workpiece can occur during ion implantation. In this case, the optical heating element of the present invention would be incorporated within, or integrated (with or without a filter or reflective element) into the implant process chamber 108 depicted in FIGS. 1A-1C.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
   a process chamber;
   an ion implantation apparatus configured to provide a beam of ions to a workpiece positioned in the process chamber;
   an optical heat source configured to selectively emit light wavelengths with a predetermined range of selected wavelengths; and
   an internally reflective optical guide coupled to the optical heat source for directing the light wavelengths in a direction toward the workpiece to heat the workpiece.

2. The ion implantation system of claim 1, further comprising a load lock chamber operatively coupled to the process chamber.

3. The ion implantation system of claim 1, wherein the heating source comprises a plurality of light-emitting diodes or a wavelength-specific lamp.

4. The ion implantation system of claim 3, wherein the light-emitting diodes are deep blue or ultraviolet light-emitting diodes.

5. The ion implantation system of claim 1, wherein the internally reflective optical guide is configured to absorb or reflect non-visible wavelengths of light energy to provide minimal non-visible wavelengths of light energy for heating the workpiece.

6. An apparatus for the processing of a semiconductor workpiece, comprising:
   a chamber configured to contain the semiconductor workpiece;
   a workpiece support configured to support the workpiece within the chamber;
   an optical heat source for emitting optical energy, the optical heat source configured to emit selective wavelengths within a predetermined range of wavelengths; and
   an internally reflective optical guide coupled to the optical heat source for directing the optical energy in a direction toward the workpiece to heat the workpiece.

7. The apparatus of claim 6, wherein the optical heat source comprises a plurality of light emitting diodes or a wavelength specific lamp.

8. The apparatus of claim 6, wherein the optical energy has a wavelength of from about 400 nm to about 1000 nm.

9. The apparatus of claim 6, wherein the optical heat source further includes a re-radiative material.

10. A method for processing a semiconductor workpiece, comprising:

placing the workpiece in a load lock chamber;

heating the workpiece with an optical heating source, the heating source configured to emit selective wavelengths within a predetermined range of wavelengths via an internally reflective optical guide for directing the optical energy in a direction toward the workpiece to heat the workpiece.

11. The method of claim 10, wherein the step of emitting selective wavelengths includes reducing emission of non-visible wavelengths of optical energy by absorbing or reflecting selected wavelengths of optical energy emitted from the optical heating source.

12. The method of claim 10, wherein the step of heating the workpiece includes heating to a temperature of from about 25° C. to about 95° C.

\* \* \* \* \*